United States Patent [19]

Swanson

[11] Patent Number: 4,518,926
[45] Date of Patent: May 21, 1985

[54] GATE-COUPLED FIELD-EFFECT TRANSISTOR PAIR AMPLIFIER

[75] Inventor: Eric J. Swanson, Reading, Pa.

[73] Assignee: AT&T Bell Laboratories, Murray Hill, N.J.

[21] Appl. No.: 451,025

[22] Filed: Dec. 20, 1982

[51] Int. Cl.³ ............................ H03F 3/16; H03F 3/45
[52] U.S. Cl. .................................. 330/253; 330/277; 330/288
[58] Field of Search ............... 330/253, 257, 269, 277, 330/288; 323/315, 316; 307/448, 450, 571, 574, 581

[56] References Cited

U.S. PATENT DOCUMENTS

| | | | |
|---|---|---|---|
| 3,509,375 | 4/1970 | Gormley | 307/581 |
| 4,042,839 | 8/1977 | Araki | 330/269 X |
| 4,069,431 | 1/1978 | Kucharewski | 330/253 X |
| 4,443,715 | 4/1984 | Fox | 307/581 X |

*Primary Examiner*—James B. Mullins
*Attorney, Agent, or Firm*—Volker R. Ulbrich

[57] ABSTRACT

An enhancement mode (104, 204, 404) and a depletion mode (102, 202, 402) pair of N-channel MOS transistors have their drain-source conduction paths connected in series and provided with a bias current means (120, 220, 306, 410). The gates (106, 206, 308, 310) are coupled together as an input node. In one embodiment (100) their bulk regions are source-connected and the output (118) is from the source of the enhancement mode device (104) to obtain a source follower configuration amplifier. In a second embodiment (200), the output (218) is taken from the drain (208) of the depletion mode device (202) to obtain a common source configuration amplifier. Two source follower pairs (302, 304) are disclosed connected in parallel to form a differential input voltage amplifier stage (300). A common source pair (402, 404) is disclosed in combination with an additional enhancement mode transistor (406) to form a current mirror (400).

6 Claims, 4 Drawing Figures

GATE-COUPLED FIELD-EFFECT TRANSISTOR PAIR AMPLIFIER

BACKGROUND OF THE INVENTION

The invention relates generally to electronic amplifiers which use field-effect transistors, and relates more particularly to those using MOSFET (metal oxide silicon field effect transistors).

Individual MOSFET devices can be connected as amplifiers in various known ways e.g. common source, common gate, common drain, source follower, etc. to provide different characteristics of operation as desired to suit a particular purpose. Two such devices can also be connected together to provide a variety of possible input and output characteristics which are not obtainable with just one device. One example of this in the commonly used "cascode" configuration, in which a first-stage device is connected in a common-source configuration, with its output going to the input of a second device connected in a common-gate configuration. The resulting structure is an amplifier having a high input impedance, low noise, and a high gain.

When a pair of MOSFET devices is connected to provide amplification, the gate of one of the devices must generally be provided with a bias voltage in order that the drain-to-source voltage of the other device will be sufficiently high to put that other device into an active operating condition in which it exhibits significant gain. The need for such bias voltage usually requires a voltage generator network on the same chip. The requirement for this network leads to increased circuit complexity and degrades the performance of the amplifier in several respects.

SUMMARY OF THE INVENTION

In accordance with the present invention an enhancement mode field-effect transistor is connected together with a depletion mode field effect transistor to provide a novel combination. The gates of the two devices are coupled together to form an input node. The drain-source conduction paths of the devices are connected in series with each other and to a bias current supply means.

The resulting gate-coupled transistor pair structure may be advantageously connected as a source follower amplifier, with the output from the source of the enhancement mode device; as a common-source amplifier, with the output from the drain of the depletion mode device; together with another, like pair for a differential input amplifier stage; and, in conjunction with an additional enhancement mode transistor as a current mirror.

DETAILED DESCRIPTION

In the discussion of the Figures below, it is assumed that all the transistors are N-channel MOS field-effect devices. Input or output voltage of a circuit from an appropriate node is with respect to some reference voltage, such as ground potential.

EXAMPLE OF FIG. 1

Figure 1:
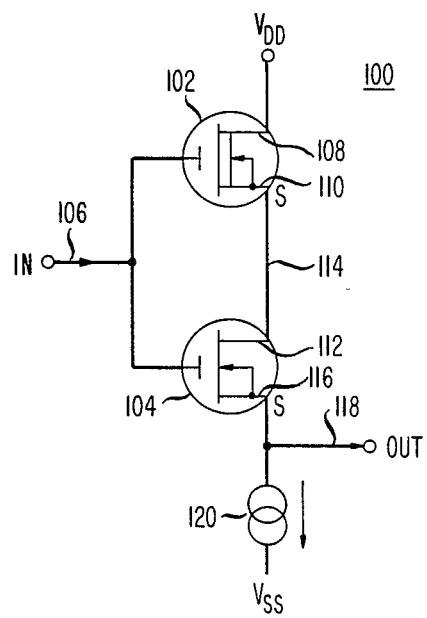
FIG. 1 is a schematic circuit diagram of a source follower amplifier circuit which includes an enhancement mode and a depletion mode transistor connected together in accordance with one example of the invention.

The FIG. 1 shows a source follower amplifier 100 in accordance with one embodiment of the invention which includes a pair of dimensionally similar MOS transistors 102, 104 having their gates connected together as a signal input node 106. The first, upper transistor 102 of the pair 102, 104 is a depletion mode device which has its drain 108 connected to a positive power supply voltage source $V_{DD}$. The source 110 of the depletion mode transistor 102 is connected to the drain 112 of the second, lower transistor 104, which is an enhancement mode device 104, at a common node 114. The source 116 of the enhancement mode transistor 104 is an output signal node 118 of the amplifier 100 and is connected in series with a bias current source means 120. The bulk regions of both the transistors 102, 104 are tied to their respective sources 110, 116. However, the bulk region of the depletion mode transistor 102 may instead be connected to the source 116 of the enhancement mode transistor 104.

The amplifier 100 has the general characteristics of a source follower configuration. While the gain is nominally unity, it has been measured as typically 0.9999, which compares favorably with the typical 0.9900 gain that would be expected for a simple source follower arrangement. Moreover, the power supply noise rejection characteristics are greatly improved over those of a single transistor connected in a source follower configuration, since the relatively high resistance presented to the power supply voltage source $V_{DD}$ at the drain 108 of the depletion mode transistor 102 greatly attenuates any coupling of it to the common mode 114, from which it undergoes further attenuation to the output node 118.

EXAMPLE OF FIG. 2

Figure 2:
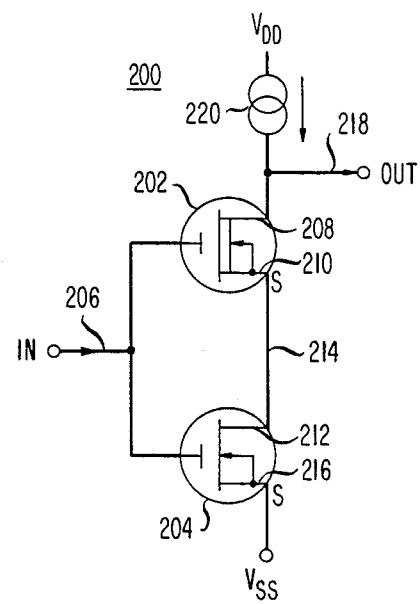
FIG. 2 is a schematic circuit diagram of a common-source amplifier circuit in accordance with a second example of the invention.

The FIG. 2 shows in accordance with another embodiment of the invention a common source amplifier 200 which includes an upper, depletion mode transistor 202 and a lower, enhancement mode transistor 204 with their gates coupled together to form an input node 206. The drain 208 of the depletion mode transistor 202 forms an output node 218 and is connected in series with a current source 220. Its source 210 is coupled to the drain 212 of the enhancement mode transistor 204 at a common node 214. The source 216 of the enhancement mode transistor 204 is connected to a negative supply voltage source $V_{SS}$. The bulk regions of both the transistors 202, 204 are tied to their respective sources 210, 216. Again, the bulk region of the depletion mode transistor may instead be connected to the source 216 of the enhancement mode transistor 204.

The amplifier 200 has the general characteristics of a common source configuration. It has a high gain, due to greatly reduced output conductance at the output node 218, and very effective power supply noise rejection, since the drain-source voltage of the enhancement transistor 204 is very well controlled as a result of its gate coupling with the depletion mode transistor 202.

EXAMPLE OF FIG. 3

Figure 3:
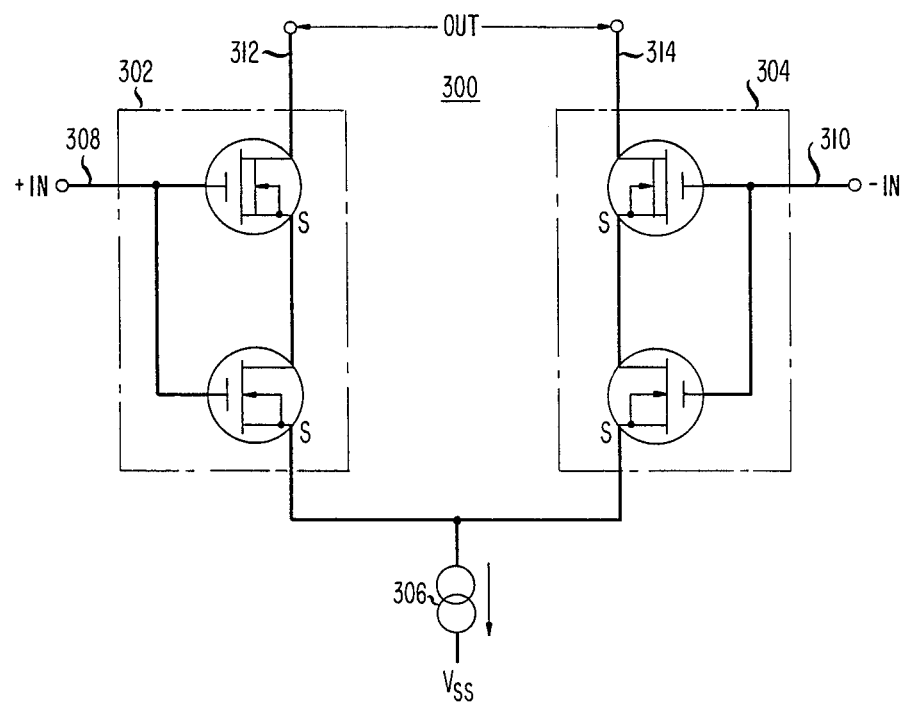
FIG. 3 is a schematic circuit diagram of a differential input stage circuit in accordance with a third example of the invention.

The FIG. 3 shows in accordance with a third embodiment of the invention a differential input voltage amplifier stage 300 which includes two gate coupled transistor pairs 302, 304, as described in the example of FIG. 1 above, connected in parallel with each other and in series with a current source 306, which couples the sources of their enhancement mode transistors to a negative supply voltage $V_{SS}$ ground. The differential inputs nodes 308, 310 are the coupled gate pairs. The output nodes 312, 314 are at the drains of the depletion node transistors; the output signal is a differential current.

The differential input stage 300 provides advantages similar to those obtained with the common source amplifier 200 for each of the differential inputs. The gate coupled pair amplifiers 302, 304 are advantageous over presently-used arrangements in that they increase the differential mode output impedance.

EXAMPLE OF FIG. 4

Figure 4:
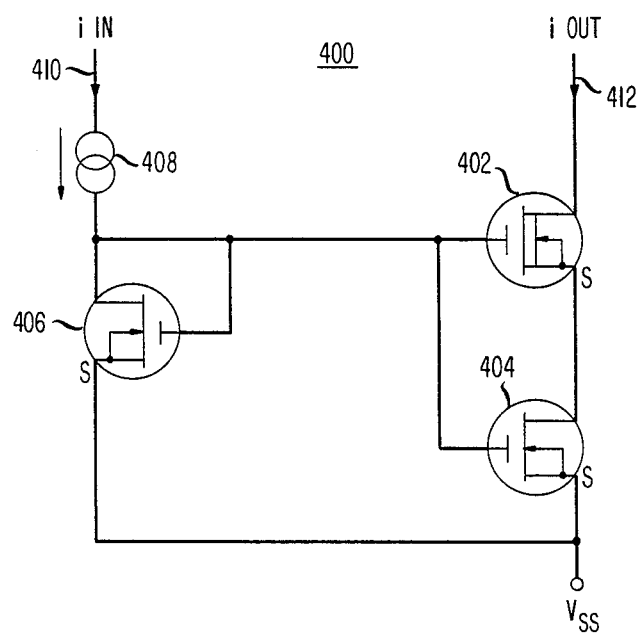
FIG. 4 is a schematic circuit diagram of a current mirror circuit in accordance with a fourth example of the invention.

The FIG. 4 shows in accordance with a fourth embodiment of the invention a current mirror 400 which includes a gate-coupled pair of depletion mode and enhancement mode transistors 402, 404, respectively, together with an additional enhancement mode transistor 406. The gates of the transistors 402, 404 are coupled to each other and to the gate and drain of the additional enhancement mode transistor 406. The additional enhancement mode transistor 406 has its bulk region tied to its source and its source connected to the source of the first enhancement mode transistor 404 at a common node coupled to a negative power supply voltage source $V_{SS}$. The drain of the additional enhancement mode transistor 406 is connected in series with a current source 408 to an input current node 410. The drain of the depletion mode transistor 402 is connected to an output current mode 412.

In response to an input current at the node 410 the current mirror 400 provides an amplifier output current at node 412 which closely follows the input current in a fixed ratio as chosen and has particularly effective power supply noise rejection. The gate-coupled pair 402, 404 significantly increases the output resistance of the current mirror 400.

GENERAL CONSIDERATIONS

The outputs of the above-described embodiments are typically taken with respect to ground potential. The term "ground" as used herein means any suitable reference potential.

In general, for any of the gate-coupled transistor pairs in accordance with the invention the bulk region of the depletion mode transistor may be connected either to the source of that transistor or to the source of the enhancement mode transistor. The choice for a particular circuit is primarily one based on available circuit chip area.

What is claimed is:

1. The combination of a first enhancement mode and a first depletion mode field effect transistor with their gates connected together and providing a linear input node, their drain-to-source conduction paths being connected in series and provided with a substantially constant bias current supply means for establishing a bias current therethrough.

2. The combination of claim 1 wherein said transistors have the same conducting channel polarity.

3. The combination of claim 2 wherein the drain of said depletion mode transistor is connected to a first polarity supply voltage means and the source of said enhancement mode transistor is connected in series with the bias current supply means to a second polarity supply voltage means, the gates providing an input node and the source of said enhancement mode transistor providing a substantially unity gain output node.

4. The combination of claim 2 wherein the source of said enhancement mode transistor is connected to a first polarity supply voltage means and the drain of said depletion mode transistor is connected in series with the bias current supply means to a second polarity supply voltage means, the gates providing an input node and the drain of said depletion mode transistor providing a voltage amplified output node.

5. The combination of claim 2 comprising a second enhancement mode and a second depletion mode field effect transistor with their gates coupled together and their drain-source conduction paths connected in series with each other and in parallel with those of said first transistors to form a common node of said first and second enhancement transistors, said common node being connected in series with the bias current supply means to a power supply voltage means, the gates of said first transistors and said second transistors providing differential input nodes and the drains of said first and second depletion mode transistors providing respective differential current output nodes.

6. The combination of claim 1 comprising a second enhancement mode transistor having its gate and its drain coupled to the gate of said first transistors and connected in series with the bias current supply means to an input current node, the source of said first and second enhancement mode transistors being connected together to a first polarity supply voltage means, the drain of said first depletion mode transistor forming an output current node with a current mirror relationship to said input current node.

* * * * *